US007386830B2

(12) United States Patent
Fukuhara

(10) Patent No.: US 7,386,830 B2
(45) Date of Patent: Jun. 10, 2008

(54) METHOD FOR DESIGNING AN ILLUMINATION LIGHT SOURCE, METHOD FOR DESIGNING A MASK PATTERN, METHOD FOR MANUFACTURING A PHOTOMASK, METHOD FOR MANUFACTURING A SEMICONDUCTOR DEVICE AND A COMPUTER PROGRAM PRODUCT

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 11/208,557

(22) Filed: Aug. 23, 2005

(65) Prior Publication Data
US 2006/0046168 A1    Mar. 2, 2006

(30) Foreign Application Priority Data
Aug. 24, 2004 (JP) .............................. P2004-243874

(51) Int. Cl.
*G06F 17/50* (2006.01)
(52) U.S. Cl. ......................................... 716/19; 716/21
(58) Field of Classification Search ............. 716/19–21
See application file for complete search history.

(56) References Cited

U.S. PATENT DOCUMENTS

| | | | |
|---|---|---|---|
| 5,465,220 | A | 11/1995 | Haruki et al. |
| 5,680,588 | A | 10/1997 | Gortych et al. |
| 6,045,976 | A | 4/2000 | Haruki et al. |
| 6,563,566 | B2 | 5/2003 | Rosenbluth et al. |
| 7,030,966 | B2 * | 4/2006 | Hansen .................. 355/67 |
| 2002/0152452 | A1 | 10/2002 | Socha |
| 2003/0236653 | A1 | 12/2003 | Zinn |
| 2004/0012764 | A1 | 1/2004 | Mulder et al. |
| 2004/0057036 | A1 | 3/2004 | Kawashima et al. |
| 2004/0137343 | A1 | 7/2004 | Eurlings et al. |
| 2004/0141167 | A1 | 7/2004 | Sasaki |
| 2004/0156030 | A1 | 8/2004 | Hansen |

(Continued)

FOREIGN PATENT DOCUMENTS

EP    1 544 679 A2    6/2005

(Continued)

OTHER PUBLICATIONS

European Search Report issued by the European Patent Office dated Dec. 1, 2005, for European Patent Application No. 05018261.7.

*Primary Examiner*—Jack Chiang
*Assistant Examiner*—Suresh Memula
(74) *Attorney, Agent, or Firm*—Finnegan, Henderson, Farabow, Garrett & Dunner, L.L.P.

(57) ABSTRACT

A method for designing an illumination light source, includes acquiring a control feature to control a dimension of a transferred pattern of a mask pattern; designating a plurality of illumination elements illuminating the mask pattern; designating first illumination lights to each of first polarization states of a light emitted from each of the illumination elements; calculating a first optical image of the control feature, formed on a first imaging plane by each of the first illumination lights; and determining an illumination shape and a polarization state distribution of the light, based on an optical characteristic of the first optical image.

18 Claims, 15 Drawing Sheets

U.S. PATENT DOCUMENTS

| | | | |
|---|---|---|---|
| 2004/0158808 A1* | 8/2004 | Hansen | 716/21 |
| 2004/0265707 A1 | 12/2004 | Socha | |
| 2005/0078293 A1 | 4/2005 | Mackey et al. | |
| 2005/0122501 A1* | 6/2005 | Rosenbluth | 355/69 |
| 2005/0134822 A1* | 6/2005 | Socha et al. | 355/69 |

FOREIGN PATENT DOCUMENTS

| | | |
|---|---|---|
| JP | 61-091662 | 5/1986 |
| JP | 2004-079714 | 3/2004 |
| JP | 2004-128108 | 4/2004 |

* cited by examiner

METHOD FOR DESIGNING AN ILLUMINATION LIGHT SOURCE, METHOD FOR DESIGNING A MASK PATTERN, METHOD FOR MANUFACTURING A PHOTOMASK, METHOD FOR MANUFACTURING A SEMICONDUCTOR DEVICE AND A COMPUTER PROGRAM PRODUCT

CROSS REFERENCE TO RELATED APPLICATIONS AND INCORPORATION BY REFERENCE

This application is based upon and claims the benefit of priority from prior Japanese Patent Application P2004-243874 filed on Aug. 24, 2004; the entire contents of which are incorporated by reference herein.

BACKGROUND OF THE INVENTION

1. Field of the Invention

The present invention relates to photolithography, and more particularly to a method for designing an illumination light source of an exposure tool, a method for designing a mask pattern, a method for manufacturing a photomask, a method for manufacturing a semiconductor device, and a computer program product for designing an illumination light source.

2. Description of the Related Art

In an exposure process for manufacturing a semiconductor device, a mask pattern drawn on a photomask is transferred onto a resist film deposited on a semiconductor substrate. In an exposure tool that transfers the mask pattern, a light emitted from an effective light source illuminates the photomask. The illumination light transmitted and diffracted from the photomask is collected on the resist film by a projection lens to form an optical image. The resist film is sensitized by the formed optical image. The exposed semiconductor substrate is developed to form a resist pattern.

Errors induced by the exposure tool may cause a dimensional variation in the resist pattern from a desired value. For example, the induced errors may include an error of an exposure dose, an error of a height of the substrate with respect to a lens, i.e., a focus error, and the like. Based on a variation tolerance of a dimension of the resist pattern, it is possible to determine the accuracy of an exposure dose and a focus, which are required for the exposure tool. The accuracy of an exposure dose and a focus are respectively referred to as an exposure latitude and a depth of focus.

Image capability of an exposure tool for a fine pattern is represented by the following Rayleigh equation:

$$R = k1 \times \lambda / NA \quad (1)$$

Here, R is the resolution of the exposure tool expressed in term of the smallest resolvable half-pitch that is one half of a minimum period of a periodic pattern. $\lambda$ is a wavelength of an exposure light. NA is a projection side numerical aperture of a projection lens of the exposure tool. k1 is a factor that indicates efficiency of a photolithography process.

When the k1 factor is lower, i.e., when a finer mask pattern is exposed without changing the wavelength $\lambda$ of the exposure light and the numerical aperture NA of the projection lens, an exposure latitude and a depth of focus for the mask pattern are decreased. Thus, a dimension of a transferred resist pattern may easily vary outside the range of a variation tolerance. Therefore, a higher transfer accuracy is required for the exposure tool.

To solve such problem, a method for increasing an exposure latitude and a depth of focus for a mask pattern by using a modified illumination has been proposed. Japanese Patent Laid-Open No. S61-91662 discloses an illumination method in which a light intensity of a periphery of an effective light source is larger than a center portion thereof. By use of the modified illumination such as an annular illumination and a quadrupole illumination, the exposure latitude and depth of focus for a fine mask pattern can be increased.

However, when the mask pattern is further miniaturized, even by using the annular illumination or the quadrupole illumination, it may be impossible to ensure a sufficient exposure latitude and a sufficient depth of focus for the mask pattern. Additionally, when a variety of features of mask patterns having different dimensions are provided in the photomask, it is not easy to determine which type of modified illumination is better to use. A method to select an optimal illumination, from among a plurality of illuminations, by trial and error is generally implemented by calculating an exposure latitude and a depth of focus. However, the method to select an optimal illumination necessitates a great amount of time and effort.

In order to optimize a shape of an illumination aperture, a proposal has been disclosed, in which an effective light source is divided into a plurality of minute areas, and a normalized image log-scale (NILS) at each of the best focus and defocus of a light intensity distribution is used as an index (see Japanese Patent Laid-Open No. P2004-128108). The normalized image log-scale is defined as a slope of the logarithm of an optical image. Additionally, there has been disclosed a method in which an effective light source is divided in a grid pattern to calculate a light intensity of a lattice point on a semiconductor substrate for each grid of the effective light source, and to optimize a shape of an illumination aperture based on a dispersity of the light intensity (see Japanese Patent Laid-Open No. P2004-79714).

Furthermore, when a pattern dimension is less than the wavelength of an illumination light, a dimensional variation of an image, depending on a polarization state of the illumination light, increases. When a light enters a surface of a semiconductor substrate, a vibration direction of an electric field vector may be perpendicular to the plane of incidence (S-polarization), or parallel to the plane of incidence (P-polarization).

The vibration directions of the electric field vectors of the P-polarized lights that interfere with each other are not parallel to each other. The vibration directions of the electric field vectors of the S-polarized lights that interfere with each other are parallel to each other. Thus, an image contrast of the P-polarization deteriorates as compared with the S-polarization. The image contrast deterioration increases as a mask pattern becomes finer. Accordingly, by applying an S-polarized light, the image contrast is improved, and exposure latitude is increased. As a result, a variation of a resist dimension may decrease.

However, in an actual photomask for semiconductor device manufacturing, mask patterns are arranged in different directions. Thus, it is not easy to determine which polarized light is used to illuminate the mask patterns.

SUMMARY OF THE INVENTION

A first aspect of the present invention inheres in a computer implemented method for designing an illumination light source, including acquiring a control feature configured to control a dimension of a transferred pattern of a mask pattern; designating a plurality of illumination elements illuminating the mask pattern; designating first illumination lights to each of first polarization states of a light emitted from each of the illumination elements; calculating a first optical image of the control feature, the first optical image formed on a first imaging plane by each of the first illumination lights; and determining an illumination shape and a polarization state distribution of the light, based on an optical characteristic of the first optical image.

A second aspect of the present invention inheres in a computer implemented method for correcting a mask pattern, including acquiring a control feature configured to control a dimension of a transferred pattern of a mask pattern; designating a plurality of illumination elements illuminating the mask pattern; designating first illumination lights to each of first polarization states of a light emitted from each of the illumination elements; calculating a first optical image of the control feature, the first optical image formed on a first imaging plane by each of the first illumination lights; providing an illumination light source by determining an illumination shape and a polarization state distribution of the light, based on an optical characteristic of the first optical image; and calculating a dimensional variation of the transferred pattern by the illumination light source so as to correct the mask pattern.

A third aspect of the present invention inheres in a method for manufacturing a photomask, including acquiring a control feature configured to control a dimension of a transferred pattern of a mask pattern; designating a plurality of illumination elements illuminating the mask pattern; designating first illumination lights to each of first polarization states of a light emitted from each of the illumination elements; calculating a first optical image of the control feature, the first optical image formed on a first imaging plane by each of the first illumination lights; providing an illumination light source by determining an illumination shape and a polarization state distribution of the light, based on an optical characteristic of the first optical image; calculating a dimensional variation of the transferred pattern by the illumination light source so as to correct the mask pattern; and generating the photomask based on the corrected mask pattern.

A fourth aspect of the present invention inheres in a method for manufacturing a semiconductor device, including acquiring a control feature configured to control a dimension of a transferred pattern of a mask pattern; designating a plurality of illumination elements illuminating the mask pattern; designating first illumination lights to each of first polarization states of a light emitted from each of the illumination elements; calculating a first optical image of the control feature, the first optical image formed on a first imaging plane by each of the first illumination lights; providing an illumination light source by determining an illumination shape and a polarization state distribution of the light, based on an optical characteristic of the first optical image; calculating a dimensional variation of the transferred pattern by the illumination light source so as to correct the mask pattern; generating a photomask based on the corrected mask pattern; adjusting an exposure tool, based on the illumination light source; loading a semiconductor substrate coated with a resist film to the exposure tool; and projecting an image of the photomask onto the semiconductor substrate, so as to transfer the corrected mask pattern on the resist film, and to form a resist pattern.

A fifth aspect of the present invention inheres in a computer program product configured to be executed by a computer, including an instruction to acquire a control feature configured to control a dimension of a transferred pattern of a mask pattern; an instruction to designate a plurality of illumination elements illuminating the mask pattern; an instruction to designate first illumination lights to each of first polarization states of a light emitted from each of the illumination elements; an instruction to calculate a first optical image of the control feature, the first optical image formed on a first imaging plane by each of the first illumination lights; and an instruction to determine an illumination shape and a polarization state distribution of the light, based on an optical characteristic of the first optical image.

DETAILED DESCRIPTION OF THE INVENTION

Figure 1:
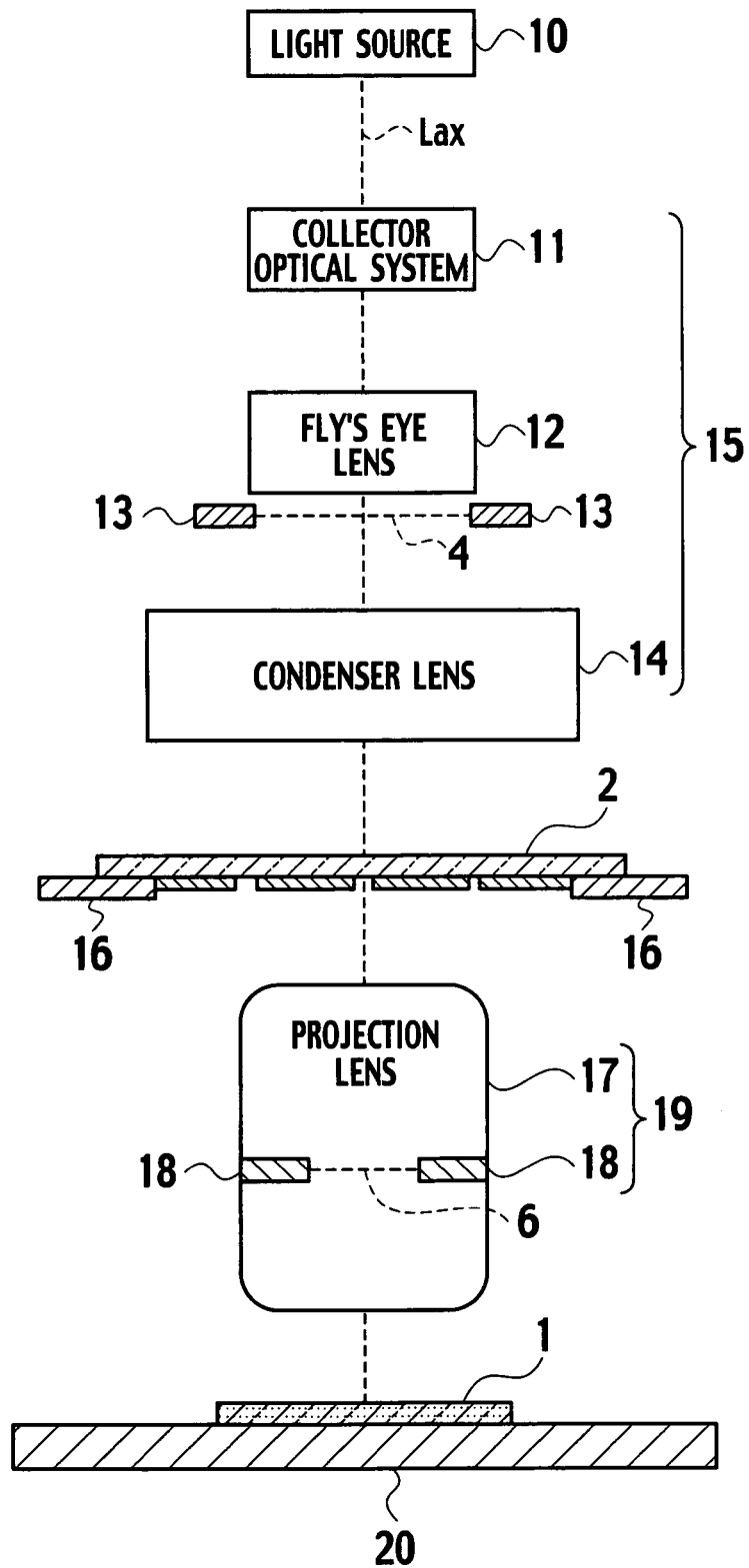
FIG. 1 is a schematic block diagram of an exposure tool for explaining an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

An exposure tool to be used for description of a method for designing an illumination light source according to an embodiment of the present invention is a refraction type projection reduction exposure tool (scanner), as shown in FIG. 1. A reduction ratio of the scanner is ¼. An argon fluoride (ArF) excimer laser having a wavelength $\lambda$ of 193 nm is used as a light source 10. An illumination optical system 15 includes a collector optical system 11, a fly's eye lens 12, an illumination aperture 13, a condenser lens 14 and the like. A projection optical system 19 includes a projection lens 17, an aperture stop 18 and the like.

An effective light source 4 is formed on a plane defining a secondary light source by the illumination aperture 13. The secondary light source is formed on an exit side of the fly's eye lens 12. A pupil 6 is a plane surrounded by the aperture stop 18. An optical axis Lax is a center line of the light source 10, the illumination optical system 15 and the projection optical system 19. The optical axis is orthogonal to the effective light source 4. By an exposure light transmitted from the light source 10, a pattern of a photomask 2 placed on a mask stage 16 between the illumination optical system 15 and the projection optical system 19 is demagnified, and projected onto a semiconductor substrate 1 on a substrate stage 20.

Note that, although the scanner has been illustrated as an exposure tool for convenience of description, a stepper or the like, other than the scanner, is also applicable. In addition, although the reduction ratio is set to ¼ an arbitrary reduction ratio is also permissible. Furthermore, the exposure tool is not limited to a refraction type exposure tool. However, reflection and catadioptric type exposure tools may be used. In the following descriptions, a dimension of the pattern on the photomask 2 is described in terms of a dimension demagnified and projected on the semiconductor substrate 1, unless otherwise indicated.

The ArF excimer laser is used as the light source 10 of the exposure tool. However, a fluoride ($F_2$) excimer laser with a wavelength $\lambda$ of 157 nm, a krypton fluoride (KrF) excimer laser with a wavelength $\lambda$ of 248 nm, and the like, may be used as the light source 10. In addition, the light source 10 is not limited to an excimer lasers. An ultraviolet light, such as I-line with a wavelength $\lambda$ of 365 nm, an extreme ultraviolet (EUV) light with a wavelength $\lambda$ of about 10 nm to about 20 nm, and the like, may also be used as the light source 10.

In the following descriptions, a dimension of the pattern on the photomask 2 is described in terms of a dimension demagnified and projected on the semiconductor substrate 1, unless otherwise noticed.

Figure 2:
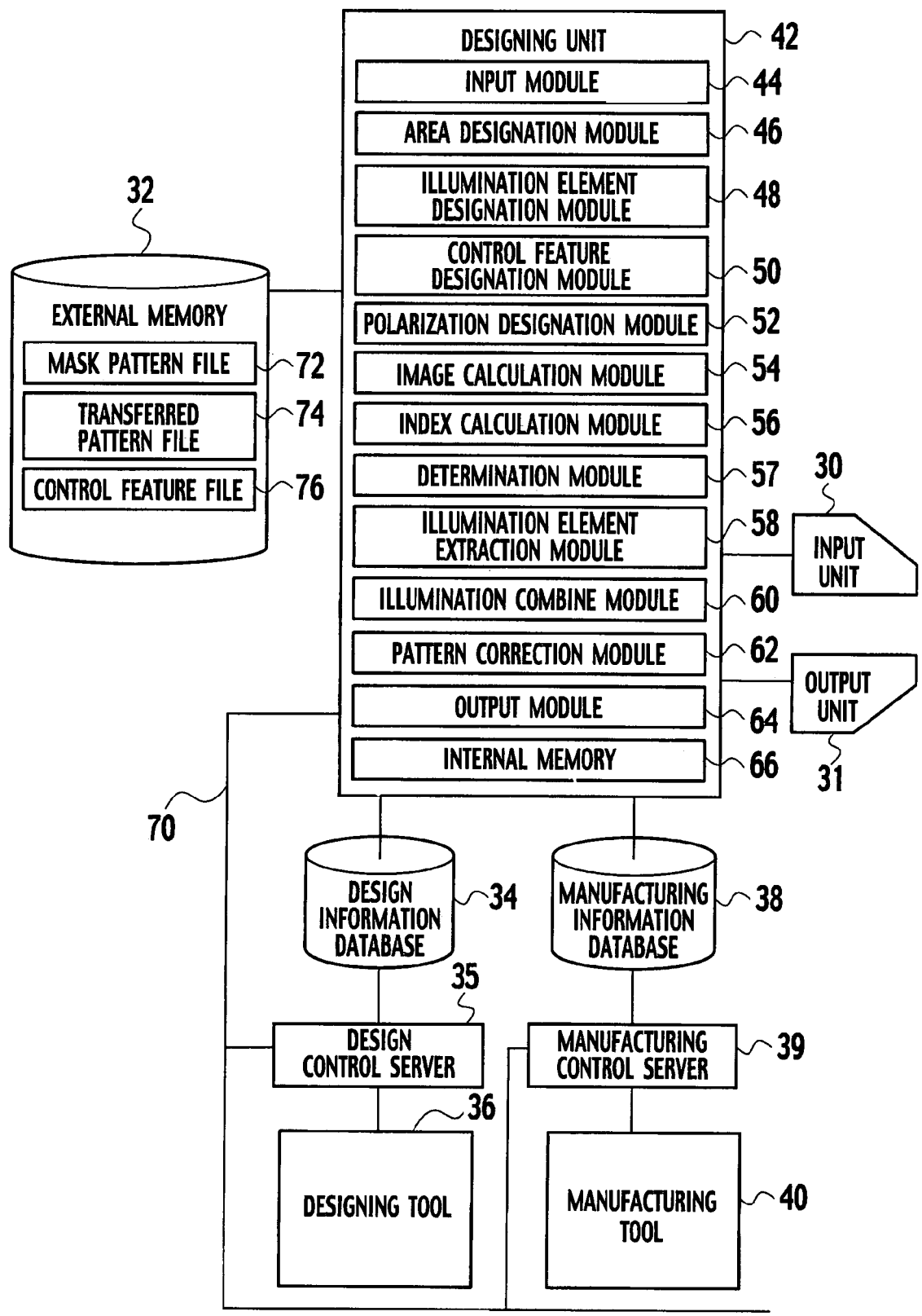
FIG. 2 is a schematic block diagram showing an example of a design system of an illumination light source according to the embodiment of the present invention.

As shown in FIG. 2, a designing system for an illumination light source according to the embodiment of the present invention includes an input unit 30, an output unit 31, an external memory 32, a design information database 34, a manufacturing information database 38, a designing unit 42, and the like. The designing information database 34 is accessed by a design control server 35 for controlling a designing tool 36. The manufacturing information database 38 is accessed by a manufacturing control server 39 for controlling a manufacturing tool 40.

The designing unit 42 includes an input module 44, an area designation module 46, an illumination element designation module 48, a control feature designation module 50, a polarization designation module 52, an image calculation module 54, an index calculation module 56, a determination module 57, an illumination element extraction module 58, an illumination combine module 60, a pattern correction module 62, an output module 64, an internal memory 66, and the like. The designing unit 42, the design control server 35, the manufacturing control server 39, and the like are interconnected via a communication network such as a local area network (LAN) 70.

The input unit 30 may be input devices, such as a keyboard and a mouse. When an input operation is executed from the input unit 30, corresponding key information is transmitted to the designing unit 42. The output unit 31 may be a screen, such as a liquid crystal display (LCD) monitor, a light emitting diode (LED) panel, an electroluminescence (EL) panel or the like. The output unit 31 is controlled by the designing unit 42. The output unit 31 displays mask pattern data or transfer pattern data acquired by the input module 44, a result of a calculation implemented by the image calculation module 54 and the index calculation module 56, an illumination shape of a light source group combined by the illumination combine module 60, mask pattern data corrected by the pattern correction module 62, and the like.

The external memory 32 stores a mask pattern file 72, a transferred pattern file 74, a control feature file 76, and the like. The mask pattern file 72 is graphic data defining a mask pattern of a photomask 2. The transferred pattern file 74 is graphic data to define a transferred pattern of the mask pattern of the photomask 2 transferred onto a resist film by the exposure tool. The control feature file 76 defines dimensions, permissible dimension errors and the like, of target control features for controlling a dimension of the transferred pattern of the mask pattern. The external memory 32 stores a program so that the designing unit 42 can implement arithmetic operations for designing an illumination light source, correcting a mask pattern and the like. The external memory 32 or the internal memory 66 of the designing unit 42 temporarily stores data obtained during such calculation and an analysis of the arithmetic operations of the designing unit 42.

In addition, the program for the designing unit 42 to implement the arithmetic operation for designing the illumination source or correcting the mask pattern is not limited to being stored in the external memory 32. For example, the program may be stored in a program memory unit (not shown) of a computer system which includes the designing unit 42 of the embodiment of the present invention. The program may be stored in a computer readable recording medium. By reading the recording medium in the program memory unit of the computer system, which includes the designing unit 42, the designing unit 42 implements the program. Here, the "computer readable recording medium" refers to a medium, such as an external memory unit of a computer, a semiconductor memory, a magnetic disk, an optical disk, a magneto optical disk, and a magnetic tape, on which the program can be recorded. Specifically, the "computer readable recording media" includes a flexible disk, a CD-ROM, a MO disk, and the like.

The designing tool 36 may be a computer-aided design (CAD) system and a pattern generator (PG), for designing a circuit of a semiconductor device and a layout of a photomask, for creating mask pattern data, for manufacturing a photomask, and the like. Circuit specifications of the semiconductor device and mask pattern data of the circuit, which are designed by the CAD system, are stored in the design information database 34 by the design control server 35. Mask pattern data corrected by the designing unit 42, after optimization by designing the illumination light source of the exposure tool, are stored in the design information database 34. Based on the mask pattern data stored in the design information database 34, a plurality of photomasks are manufactured for semiconductor manufacturing by the PG of the designing tool 36 or by an external mask maker.

The manufacturing tool 40 includes various manufacturing apparatuses provided in manufacturing facilities for manufacturing semiconductor devices. For example, the manufacturing apparatuses include a chemical vapor deposition (CVD) apparatus, an oxidation apparatus, an annealing apparatus, an exposure tool, a developer, an etcher, an evaporator, and the like. The manufacturing apparatuses respectively execute various manufacturing processes of the semiconductor device, and various performance tests of the manufacturing apparatuses based on process conditions acquired from the manufacturing control server 39.

The manufacturing control server 39 stores specifications of the manufacturing apparatuses, data of the executed performance tests, and the like, as apparatus information, in the manufacturing information database 38. For example, specifications or measurement data of an illumination shape, a polarization state distribution and the like, of the exposure tool shown in FIG. 1 is stored as illumination light source data in the manufacturing information database 38.

The input module 44 of the designing unit 42 acquires a mask pattern, a transferred pattern, and a control feature from the mask pattern file 72, the transferred pattern file 74 and the control feature file 76, respectively, which are used for designing an illumination light source.

Figure 3:
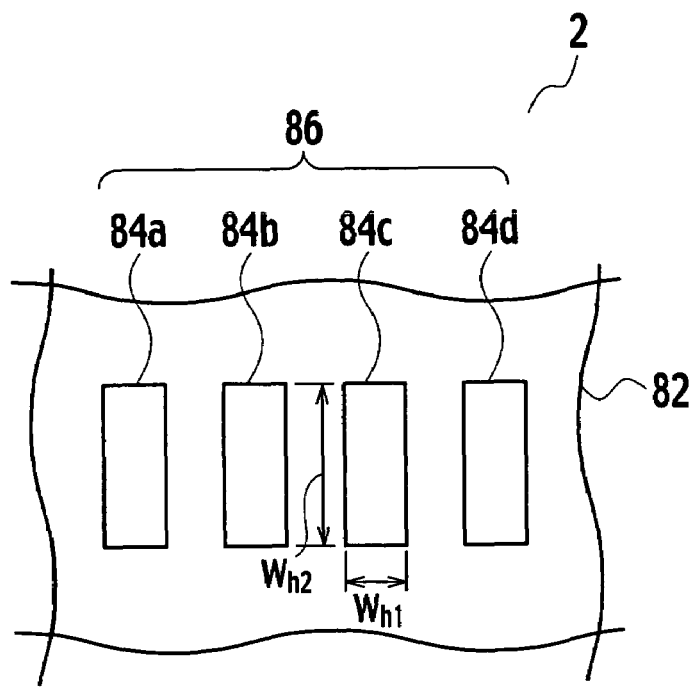
FIG. 3 is a plan view showing an example of a photomask for designing the illumination light source according to the embodiment of the present invention.
Figure 4:
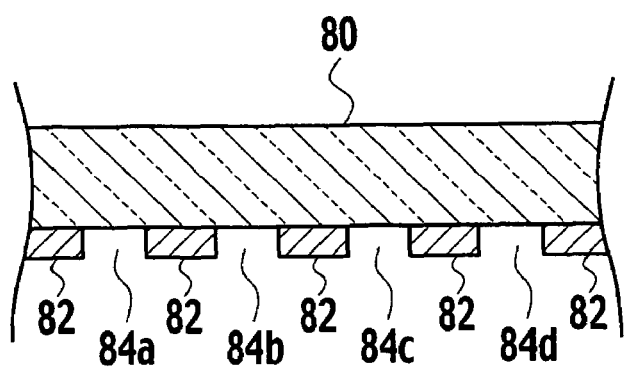
FIG. 4 is a cross sectional view showing an example of the photomask for designing the illumination light source according to the embodiment of the present invention.

For example, as shown in FIGS. 3 and 4, a mask pattern 86 of the photomask 2 is a pattern for forming via holes periodically arranged inline. The mask pattern 86 includes a plurality of openings 84a, 84b, 84c and 84d periodically disposed in an opaque film 82 on a transparent substrate 80. The openings 84a to 84d are provided with a width $W_{h1}$ in a period direction which is a periodically disposed direction of the openings 84a to 84d, and a width $W_{h2}$ in a direction orthogonal to the period direction. Each space width between the openings 84a to 84d is provided almost equal to the width $W_{h1}$ in the period direction.

Figure 5:
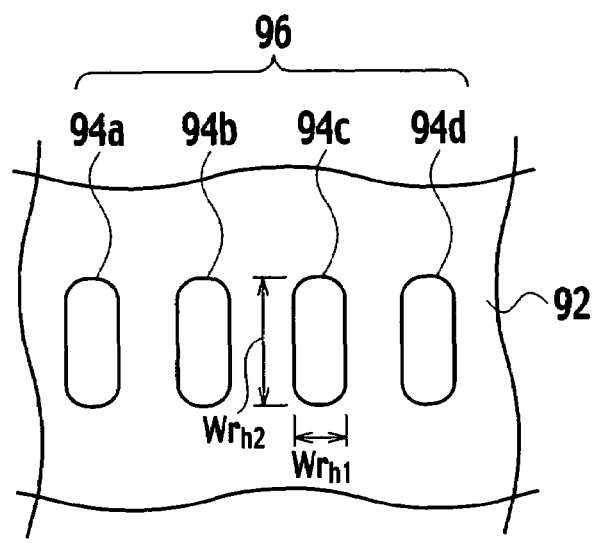
FIG. 5 is a plan view showing an example of a transferred pattern for designing the illumination light source according to the embodiment of the present invention.
Figure 6:
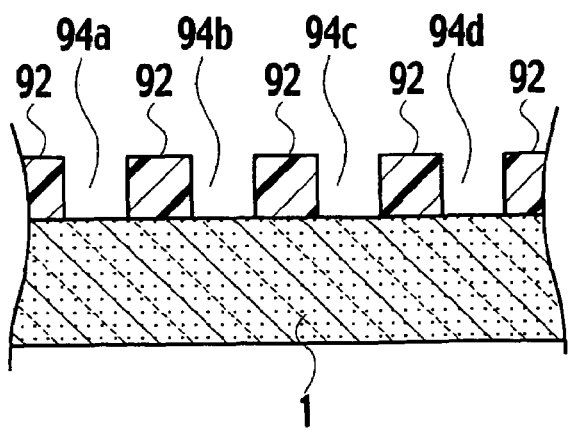
FIG. 6 is a cross sectional view showing an example of a transferred pattern for designing the illumination light source according to the embodiment of the present invention.

As shown in FIGS. 5 and 6, a transferred pattern 96 of the mask pattern 86 using the exposure tool shown in FIG. 1, includes openings 94a, 94b, 94c and 94d periodically disposed in a resist film 92 on the semiconductor substrate 1. The openings 94a to 94d are arranged with a width $Wr_{h1}$ in a period direction which is a periodically disposed direction of the openings 94a to 94d, and a width $Wr_{h2}$ in a direction orthogonal to the period direction of the openings 94a to 94d.

When the widths $W_{h1}$ and $W_{h2}$ of the openings 84a to 84d of the mask pattern 86 are on the order of a resolution limit of the exposure tool or a critical dimension (CD) which is a dimension of the smallest geometrical feature, shapes and widths $Wr_{h1}$, $Wr_{h2}$ of the openings 94a to 94d of the transferred pattern 96 vary by an optical proximity effect (OPE), a process proximity effect (PPE) and the like, due to the pattern density of the mask pattern 86. For example, when the mask pattern 86 of the hole pattern shown in FIG. 3 is transferred to the resist film 92, in the transferred pattern 96, the openings 94a to 94d are deformed into elliptical shapes, and the width $Wr_{h1}$ and $Wr_{h2}$ are reduced. The mask pattern 86 having such periodically arranged features is defined as a dimension control feature. The widths $Wr_{h1}$ and $Wr_{h2}$ of the openings 94a to 94d of the transferred pattern 96 are subjected to dimension control.

Figure 7:
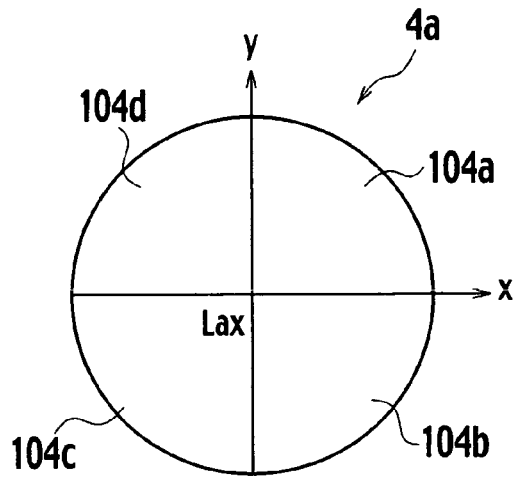
FIG. 7 is a view showing an example for designating illumination areas according to the embodiment of the present invention.

The area designation module 46 divides a plane, including the effective light source 4 of the exposure tool acquired from the manufacturing information database 38, into a plurality of illumination areas 104a, 104b, 104c and 104d which are symmetrical with respect to the optical axis Lax of the exposure tool. As shown in FIG. 7, a maximum illumination area 4a of the effective light source 4 is divided into four areas by x and y axes orthogonal to each other at the optical axis Lax to define the illumination areas 104a to 104d. For example, as shown in FIG. 7, the maximum illumination area 4a is approximately circular, and is formed by the entire secondary light source on the exit side of the fly's eye lens 12.

Figure 8:
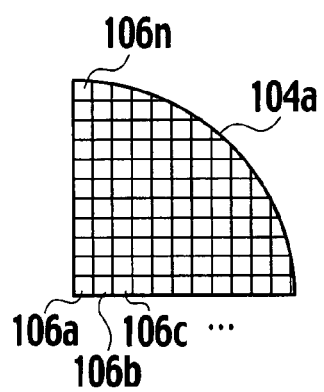
FIG. 8 is a view showing an example for designating illumination elements according to the embodiment of the present invention.

As shown in FIG. 8, the illumination element designation module 48 subdivides, for example, the illumination area 104a, among the divided illumination areas 104a to 104d, to define a plurality of illumination elements 106a, 106b, 106c, . . . , and 106n. A point light source or a surface light source is designated in each of the plurality of illumination elements 106a to 106n.

Figure 9:
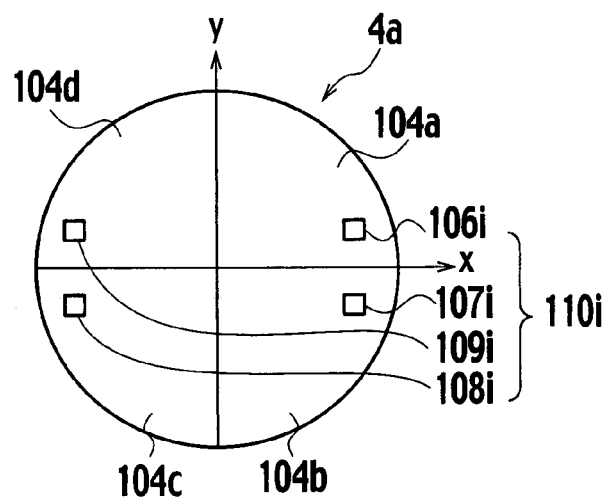
FIG. 9 is a view showing an example for designating a light source group according to the embodiment of the present invention.

For each of the plurality of illumination elements 106a to 106n, the illumination element designation module 48 designates a light source group which is a set of illumination elements in symmetrical positions in the plurality of illumination areas 104a to 104d. As shown in FIG. 9, regarding an illumination element 106i, for example, from among the plurality of illumination elements 106a to 106n, an illumination element 107i symmetrical to the illumination element 106i with respect to the x axis is designated in the illumination area 104b. Illumination elements 109i and 108i, respectively symmetrical to the illumination elements 106i and 107i with respect to the y axis, are designated in the illumination areas 104d and 104c. As a result, a light source group 110i having the illumination elements 106i, 107i, 108i and 109i is designated in the maximum illumination area 4a. Thus, a plurality of light source groups corresponding to the plurality of illumination elements 106a, 106b, 106c, . . . , 106n are designated in the maximum illumination area 4a.

The control feature designation module 50 designates a dimension control direction from the control feature acquired by the input module 44. For example, when the control feature is the mask pattern 86 shown in FIG. 3, as dimension control directions, the period direction of the openings 84a to 84d (referred to as a first dimension control direction hereinafter), and the direction orthogonal to the period direction (referred to as a second dimension control direction hereinafter) are designated.

The polarization designation module 52 designates a polarization state of a light emitted from each of the light source groups 110a to 110n of the effective light sources corresponding to the designated control feature. For example, an illumination light from the illumination optical system 15 is designated as a linearly polarized light. A polarization direction of the linearly polarized light is used as a polarization state. Here, the "polarization direction" is defined by a vibration direction of an electric field vector of the illumination light. Hereinafter, to simplify explanations, the x axis of the maximum illumination area 4a shown in FIG. 7 is assigned as the first dimension control direction.

Figure 10:
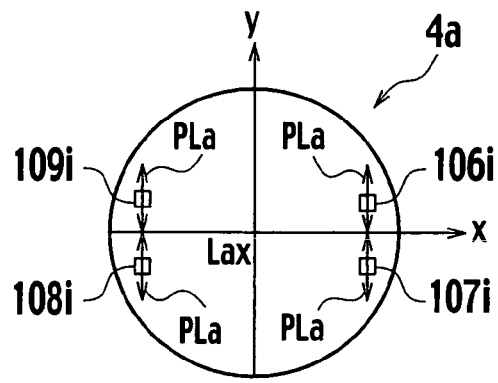
FIG. 10 is a view showing an example for designating a polarization state according to the embodiment of the present invention.
Figure 11:
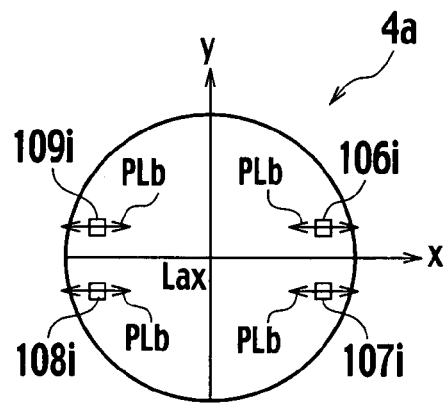
FIG. 11 is a view showing another example for designating a polarization state according to the embodiment of the present invention.

For example, when a dimension control direction is the first dimension control direction, as shown in FIG. 10, a polarization state of each of the illumination elements 106i to 109i of the light source group 110i, shown in FIG. 9, is designated as y-polarization Pla, which is a polarization direction parallel to the y axis. On the other hand, when a dimension control direction is the second dimension control direction, as shown in FIG. 11, a polarization state of each of the illumination elements 106i to 109i is designated as x-polarization PLb, which is a polarization direction parallel to the x axis. In the description below, especially when the x and y axes are omitted in the drawings of the effective light source 4 and the maximum illumination area 4a, a horizontal direction of the drawing will be assigned as x axis direction, and a vertical direction will be assigned as y axis direction.

Figure 12:
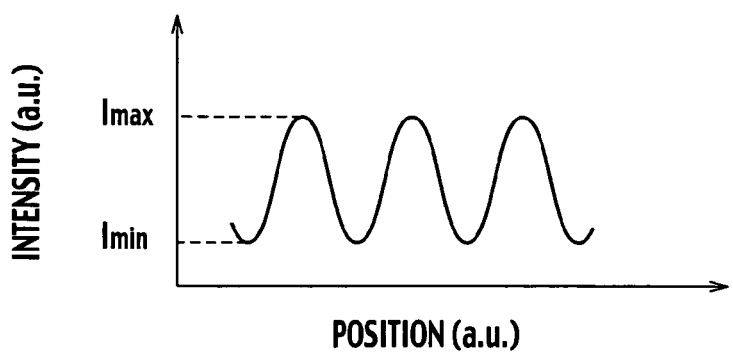
FIG. 12 is a diagram showing an example of a optical image according to the embodiment of the present invention.

The image calculation module 54 calculates an optical image of the mask pattern 86 projected by a projection optical system 19, designating a polarization direction for an illumination of the light source group 110i in the exposure tool shown in FIG. 1. As shown in FIG. 12, the calculated optical image is an image intensity distribution of a direction corresponding to the dimension control direction of the mask pattern 86 on a plane of a predetermined level in the resist film coated on the semiconductor substrate 1. The optical image is calculated based on a vector model and considering polarization. The plane in the resist film in which the optical image is calculated is optically conjugate with a mask pattern surface (best focus plane hereinafter). Alternatively, the plane may be near the best focus plane as long as a defocus distance is within a negligible range as compared with the depth of focus (DOF) of the exposure tool.

The index calculation module 56 calculates an index to indicate an optical characteristic of the optical image. For example, an image contrast Ctr is calculated as an index of the optical image. As shown in FIG. 12, the image contrast Ctr is represented by the following equation:

$$Ctr = (I_{max} - I_{min})/(I_{max} + I_{min}) \quad (2)$$

Here, $I_{max}$ and $I_{min}$ are maximum and minimum values of intensity of the optical image, respectively.

When the image contrast of the optical image is small, a dimensional variation of the transferred pattern increases by a variation in exposure dose. Accordingly, it is desirable to increase the image contrast in order to suppress the dimensional variation of the transferred pattern by increasing an exposure latitude (EL).

Illuminating a periodic mask pattern, zero-order to high-order diffracted lights are generated. When a period of the periodic mask pattern is reduced, angles of the diffracted lights are increased so that low-order diffracted lights only contribute to image formation. The optical image is formed mainly by a two-beam interference between the zero-order and first-order diffracted lights. However, an intensity level of interference is decreased for diffracted lights in which the polarization directions are not parallel to each other.

Figure 13:
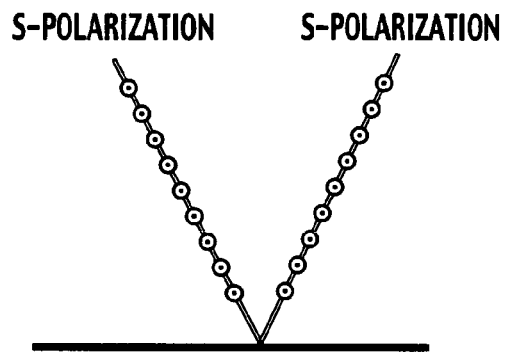
FIGS. 13 and 14 are views showing examples of polarization states according to the embodiment of the present invention.
Figure 14:
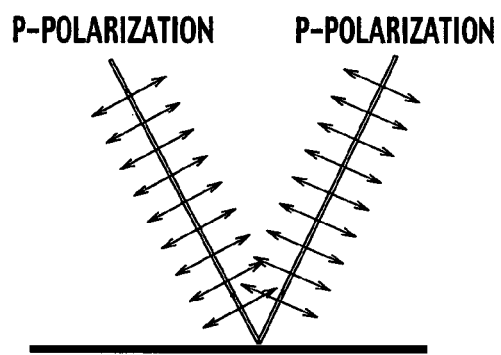

For example, as shown in FIGS. 13 and 14, polarization states of polarized lights that enter a surface of the resist film include S-polarization and P-polarization states. In the S-polarization state, the polarization direction is perpendicular to the plane of incidence of the polarized light. In the P-polarization state, the polarization direction is parallel to the plane of incidence of the polarized light. In the case of P-polarization, the polarization directions of incident polarized lights are not parallel to each other. Thus, the interference intensity level between the incident lights is decreased.

Figure 15:
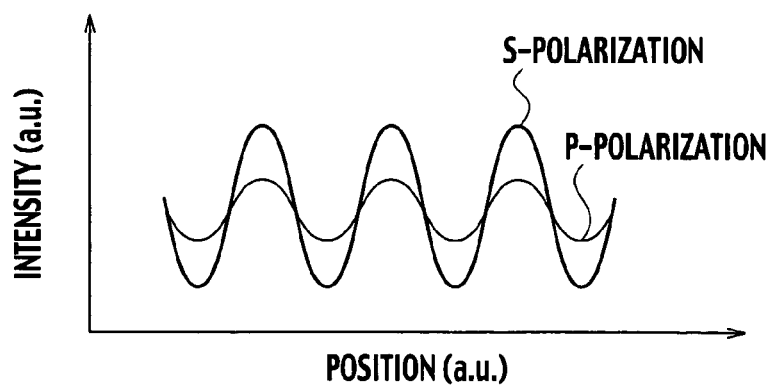
FIG. 15 is a diagram showing examples of optical images projected with polarization states shown in FIGS. 13 and 14.

On the other hand, in the case of S-polarization, the polarization directions of incident polarized lights are parallel to each other. Thus, the interference intensity level between the incident lights is large. As a result, as shown in FIG. 15, image contrast of the optical image is improved in the S-polarized light compared with the P-polarized light. By applying an S-polarized light, an exposure latitude is increased to reduce a dimensional variation of the transferred pattern of the resist film.

Figure 16:
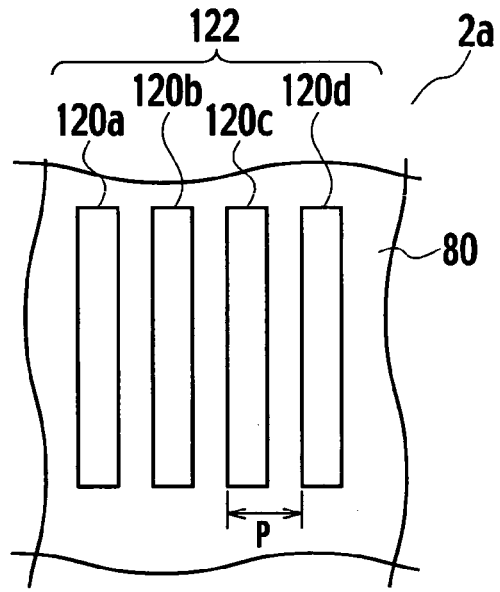
FIG. 16 is a view showing an example of a mask pattern for explaining an effect of a polarization state.

For example, as shown in FIG. 16, a mask pattern of a photomask 2a is a line and space (L/S) pattern 122. The L/S pattern 122 includes a plurality of line patterns 120a, 120b, 120c and 120d periodically arranged on the transparent substrate 80. The plurality of line patterns 120a to 120d are arranged with a pitch P in a period direction. A space width between every two of the plurality of line patterns 120a to 120d is almost equal to a half pitch P/2.

Figure 17:
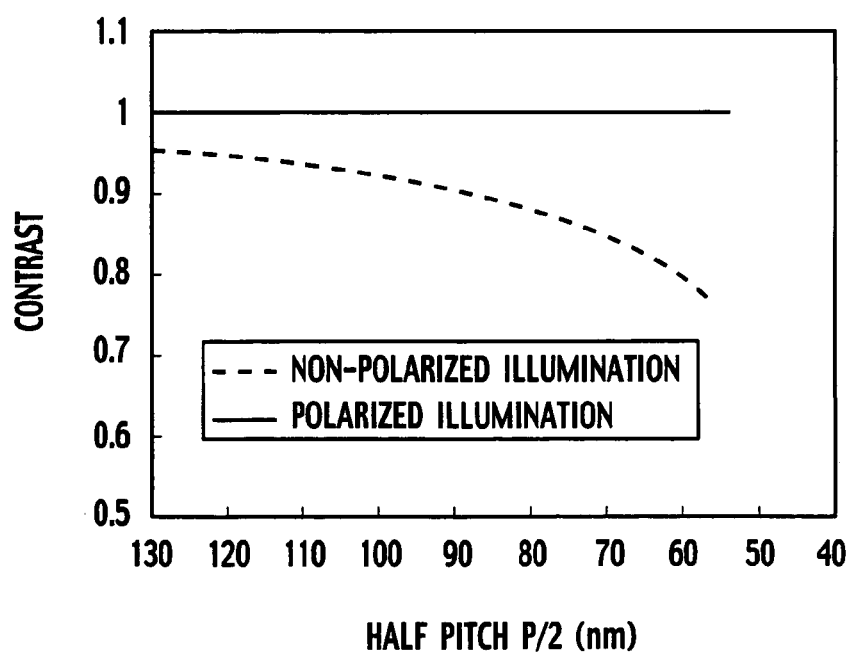
FIG. 17 is a diagram showing an example for explaining a relation of a half pitch and an image contrast.

When the L/S pattern 122 is illuminated by an illumination light in which the polarization direction is orthogonal to the direction of the plurality of line patterns 120a to 120d by the exposure tool shown in FIG. 1, the incident light to the resist film on the semiconductor substrate 1 is S-polarized. FIG. 17 shows a relation between the pitch P and the image contrast of the optical image when the L/S pattern 122 is illuminated by an illumination light having a wavelength of 193 nm from the light source 10. With polarized illumination, no reduction occurs in image contrast. In non-polarized illumination, by reducing the pitch P, the image contrast is reduced. The effect of the polarized illumination increase as the pitch P decreases.

The determination module 57 determines whether indices have been calculated for the light source groups, the dimension control directions, and the polarization states, respectively, designated by the illumination element designation module 48, the control feature designation module 50, and the polarization designation module 52. Additionally, based on the calculated index, an optimal polarization state is determined from among the designated polarization states.

The illumination element extraction module 58 extracts a light source group based on the calculated index. In each dimension control direction, image contrast of the optical image is calculated by using the plurality of light source groups corresponding to the plurality of illumination elements 106a to 106n. The plurality of light source groups are sequenced in descending order of the image contrast that was calculated by using the plurality of light source groups. A light source group which provides an image contrast, equal to or greater than a predetermined reference value, is extracted.

Figure 18:
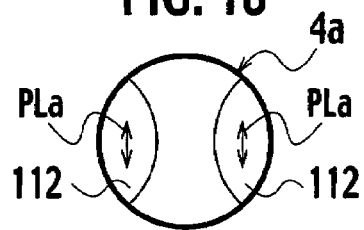
FIG. 18 is a view showing an example of an illumination extracted by designing an illumination light source according to the embodiment of the present invention.

For example, as shown in FIG. 18, light source groups extracted for the first dimension control direction form first illuminations 112, which face each other at outer edge portions of the maximum illumination area 4a in the first dimension control direction. The first illuminations 112 are in they-polarization PLa orthogonal to the first dimension control direction.

Figure 19:
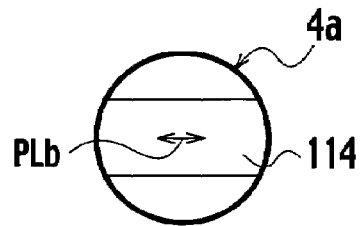
FIG. 19 is a view showing another example of an illumination extracted by designing an illumination light source according to the embodiment of the present invention.

As shown in FIG. 19, light source groups extracted for the second dimension control direction form a second illumination 114, which extends in the first dimension control direction in a center portion of the maximum illumination area 4a. The second illumination 114 is in the x-polarization PLb orthogonal to the second dimension control direction.

The illumination combine module 60 executes a logic operation such as logic addition (OR operation) or logic multiplication (AND operation), for the extracted light source groups to combine the illuminations. For example, by an OR operation for the first and second illuminations 112 and 114, a combined illumination shape is provided. In an overlapping area of the first and second illuminations 112 and 114, the polarization state of a dimension control direction having a smaller permissible dimension error in the first and second dimension control directions is used.

Figure 20:
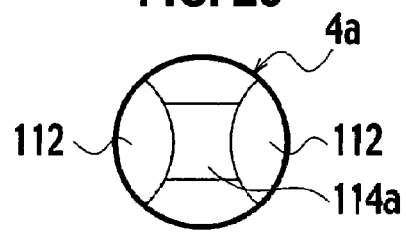
FIG. 20 is a view showing an example of an illumination combined by designing an illumination light source according to the embodiment of the present invention.
Figure 21:
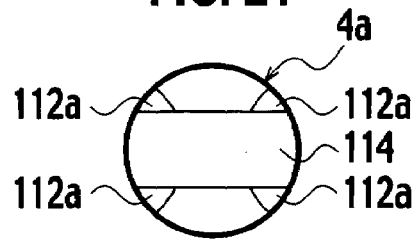
FIG. 21 is a view showing an example of another illumination combined by designing an illumination light source according to the embodiment of the present invention.

When the permissible dimension error of the first dimension control direction is smaller than the second dimension control direction, as shown in FIG. 20, a design illumination light source having opposing first illuminations 112 and a second illumination 114a extending therebetween is obtained by combining the first and second illuminations 112 and 114a. Additionally, when the permissible dimension error of the second dimension control direction is smaller than the first dimension control direction, as shown in FIG. 21, a design illumination light source having a second illumination 114 extending in the first dimension control direction and opposing first illuminations 112a sandwiching the second illumination 114 is obtained by combining the first and second illuminations 112a and 114.

Figure 22:
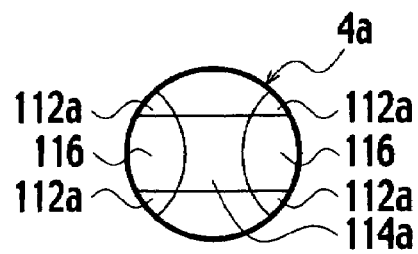
FIG. 22 is a view showing still another example of an illumination combined by designing an illumination light source according to the embodiment of the present invention.

When the permissible dimension errors of the first and second dimension control directions are approximately equal, as shown in FIG. 22, the overlapping area of the first and second illuminations 112 and 114 is designated as third illuminations 116. An intermediate polarization direction between the polarization directions PLa and PLb may be used for the polarization state of the third illuminations 116. Alternatively, as a polarization state of the third illuminations 116, a non-polarization or circular polarization may be used. When the calculated distribution of a polarization state cannot be obtained because of the optical design or the structure of the exposure tool, an illumination shape and a polarization state distribution that are feasible and most similar to the calculated illumination, may be used.

The pattern correction module 62 calculates an amount of correction of the mask pattern based on the optical image of the mask pattern. The amount of correction is calculated by the image calculation module 54, using the combined design illumination light source. If the correction amount is larger than the reference value, the mask pattern is corrected. In addition, for correcting the mask pattern, the feasibility of a corrected mask pattern is taken into consideration. When a width of an opaque portion or a transparent portion of the corrected mask pattern is equal to or less than a resolution limit dimension of the PG or the like, for example, when the width is equal to or less than about 150 nm on the photomask, it is difficult to accurately draw the mask pattern. In such case, the mask pattern is corrected within a range of the resolution limit dimension which enables accurate drawing of the mask pattern. The mask pattern is not limited to a binary mask which has an opaque portion and an opening. A mask pattern, such as an attenuated phase shift mask, an alternating phase shift mask, and a chromeless phase shift mask, can be processed as a correction target.

The output module 64 transfers the combined illumination shape and polarization state distribution to the manufacturing control server 39 and the design control server 35.

Figure 23:
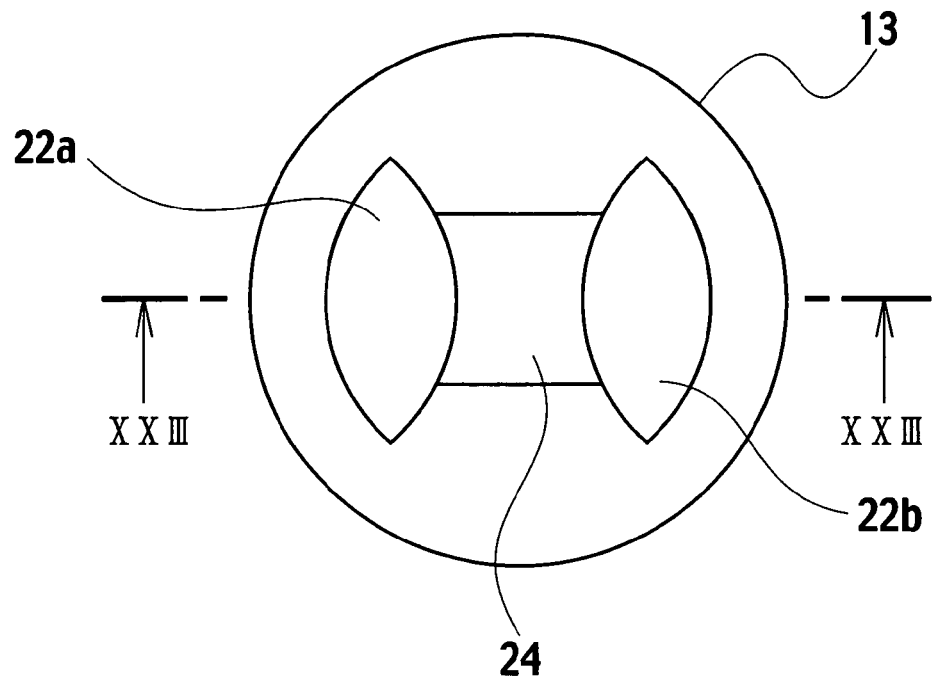
FIG. 23 is a view showing an example of an illumination aperture fabricated by designing an illumination light source according to the embodiment of the present invention.
Figure 24:
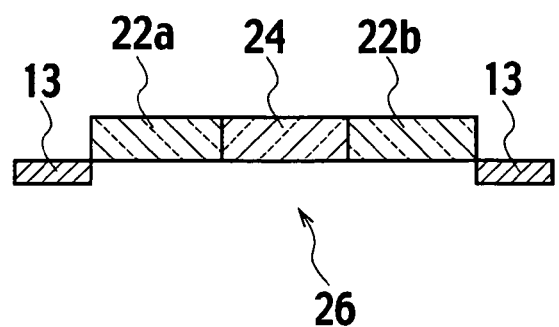
FIG. 24 is a cross sectional view showing an example of the illumination aperture taken along line XXIII-XXIII in FIG. 23.

Based on information of the design illumination light source obtained by the designing unit 42 according to the embodiment of the present invention, a shape of the illumination aperture 13 and a polarization state of the illumination light of the exposure tool are determined. For example, when the design illumination light source, shown in FIG. 20, is determined, as shown in FIGS. 23 and 24, first polarizers 22a and 22b and a second polarizer 24 are provided in an opening 26 of the illumination aperture 13. The polarizers correspond to a shape determined by an OR combining operation of the first and second illuminations 112 and 114. The illumination aperture 13 is an opaque material. The first polarizers 22a and 22b, which face each other, correspond to the shape of the first illumination 112, and polarize an incident illumination light in a direction of the y-polarization PLa. The second polarizer 24 polarizes the incident illumination light in a direction of the x-polarization PLb. For the first and second polarizers 22a, 22b and 24, a quarter-wave plate and a half-wave plate are used, respectively.

In addition, formation of the shape of the illumination light source is not limited to use of the illumination aperture 13. For example, a zoom lens, an axicon lens and the like, may be disposed between the fly's eye lens 12 and the effective light source 4 to restrict the diameter of the illumination light.

In the designing unit 42, the shape and the distribution of the polarization of the illumination light source are provided to improve the image contrast of the optical image. As a result, the exposure latitude EL of the exposure tool is increased to suppress a dimensional variation of the transferred pattern.

Additionally, to ensure telecentricity of the illumination light, an illumination light source symmetric to the optical axis is desirable. In the embodiment of the present invention, optical axis symmetry is ensured for the illumination elements 106i to 109i of the light source group 110i, shown in FIG. 9. Therefore, telecentricity collapse may not occur, even in the illumination light source provided by the designing unit 42.

Figure 25:
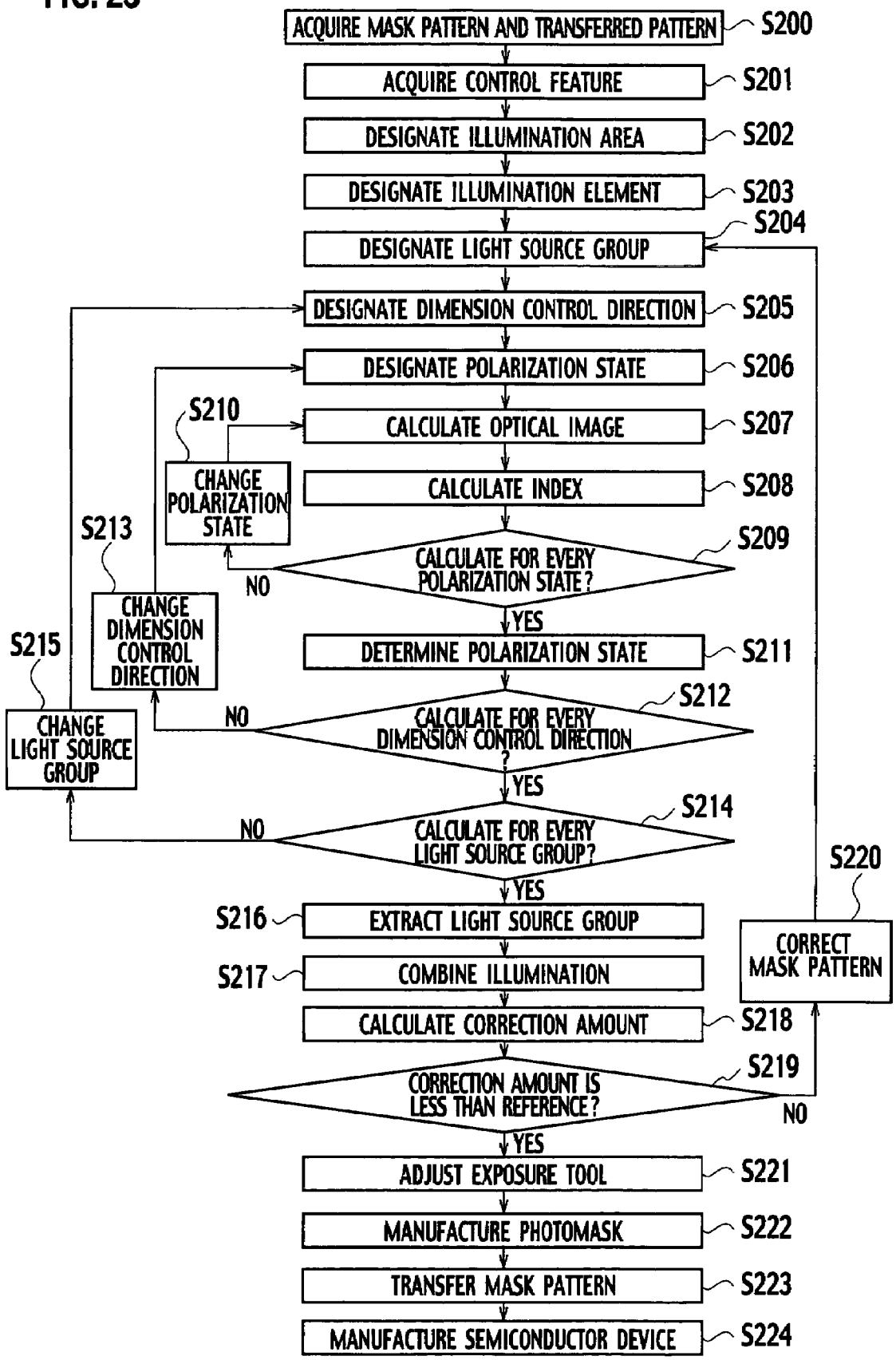
FIG. 25 is a flowchart showing an example of a correction method for a mask pattern and a manufacturing method for a semiconductor device by applying a method for designing an illumination light source according to the embodiment of the present invention.

Next, a method for designing a mask pattern and a method for manufacturing a semiconductor device, using a method for designing an illumination light source according to the embodiment, is described with reference to a flowchart of FIG. 25. The external memory 32 stores a mask pattern file 72, a transferred pattern file 74, and a control feature file 76, for defining the mask pattern 86, the transferred pattern 96, and the control feature, respectively, which are used for designing the illumination light source of the exposure tool.

In Step S200, the input module 44 of the designing unit 42 acquires the mask pattern 86 and the transferred pattern 96, which are designing targets of the illumination light source, from the mask pattern file 72 and the transferred pattern file 74 of the external memory 32. In Step S201, the control feature is acquired from the control feature file 76 by the input module 44.

In Step S202, the area designation module 46 divdes a plane that includes the effective light source 4 of the exposure tool, acquired from the manufacturing information database 38, into a plurality of illumination areas 104a to 104d which are symmetrical with respect to the optical axis of the exposure tool. In Step S203, the illumination element designation module 48 subdivides the illumination area 104a, for example, to designate a plurality of illumination elements 106a, 106b, 106c, . . . , 106n. In Step S204, the illumination element designation module 48 designates point or surface light sources in the plurality of illumination elements 106a to 106n.

In Step S205, the control feature designation module 50 designates a dimension control direction based on the control feature acquired by the input module 44. In Step S206, the polarization designation module 52 designates a first polarization state for a light emitted from the light source group of the effective light source corresponding to the designated control feature.

In Step S207, the image calculation module 54 calculates a first optical image of the mask pattern 86 projected by the projection optical system 19 in the exposure tool, using illumination of the light source group 110i in which the first polarization state is designated. In Step S208, the index calculation module 56 calculates an index indicating an optical characteristic of the first optical image, for example, an image contrast.

In Step S209, the determination module 57 determines whether index calculation processing has been executed for all the polarization states set in Step S206. If there is an unprocessed polarization state, in Step S210, the polarization state is changed to a second polarization state and the processing of Step S207 and Step S208 is repeated to calculate an index of the second optical image.

In Step S211, the determination module 57 determines an optimal polarization state from among all the polarization states, based on the calculated index. In Step S212, the determination module 57 determines whether index calculation processing has been executed for all the dimension control directions. If there is an unprocessed dimension control direction, in Step S213, the dimension control direction is changed and the processing of Step S206 to Step S211 is repeated.

In Step S214, the determination module 57 determines whether index calculation processing has been executed for all the light source groups. If there is an unprocessed light source group, in Step S215, the light source group is changed and the processing of Step S205 to Step S212 is repeated.

In Step S216, the illumination element extraction module 58 extracts light source groups based on the calculated index. First and second illuminations 112 and 114 are formed by illumination elements included in the extracted light source groups. In Step S217, the illumination combine module 60 implements an OR operation or an AND operation for the first and second illuminations 112 and 114, so as to combine a design illumination light source.

In Step S218, the pattern correction module 62 calculates a correction amount of the mask pattern 86, based on the optical image of the mask pattern 86 that is calculated by using the combined design illumination light source in the image calculation module 54. In Step S219, it is determined whether the calculated correction amount is equal to or less than a reference value. If the correction amount is larger than the reference value, the mask pattern 86 is corrected in Step S220, and the processing of the steps S204 to S218 is repeated to create a corrected mask pattern.

In Step S221, the illumination aperture 13 of the exposure tool is adjusted based on the design illumination light source to form an illumination light source. In Step S222, a corrected photomask is manufactured based on the corrected mask pattern. In Step S223, the manufactured photomask is loaded on the exposure tool, and the corrected mask pattern is transferred onto the resist film deposited on the semiconductor substrate 1 to form a resist pattern. In Step S224, the semiconductor substrate 1 is processed by using the transferred resist pattern as a mask. Thus, the manufacturing processes of the semiconductor device are implemented.

According to the embodiment of the present invention, the exposure latitude EL of the exposure tool is increased to design the illumination light source, which suppresses a dimensional variation of the transferred pattern. Since the mask pattern correction is executed by obtaining and using the design illumination light source, correction accuracy is improved. Moreover, the corrected mask pattern is transferred by the exposure tool using the designed illumination light source. Thus, a dimensional variation of the resist pattern caused by an exposure dose error is suppressed to increase the manufacturing yield of the semiconductor device.

In the embodiment of the present invention, as shown in FIG. 3, the regularly arranged rectangular hole patterns are used as the control feature of the mask patterns 86. However, the control feature is not so limited. For example, mask patterns of irregular shapes arranged in a random direction may be used. In the patterns arranged in a random direction, a plurality of dimension control directions are used.

Figure 26:
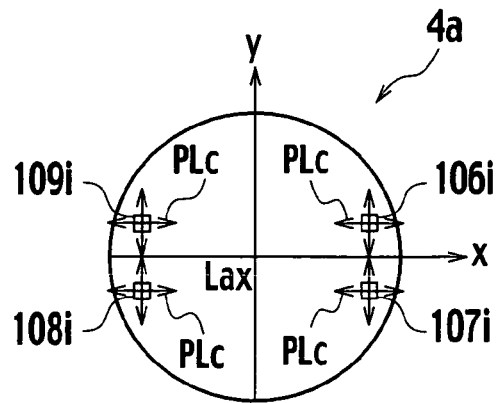
FIG. 26 is a view showing still another example for designating a polarization state according to the embodiment of the present invention.
Figure 27:
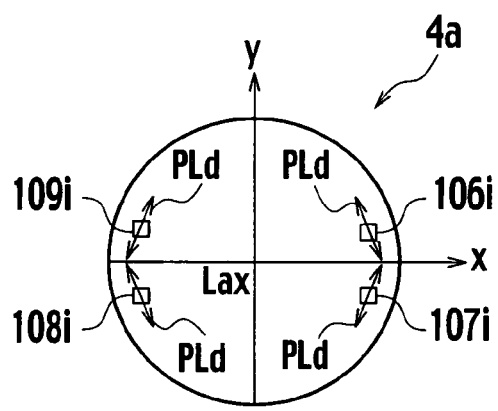
FIG. 27 is a view showing still another example for designating a polarization state according to the embodiment of the present invention.
Figure 28:
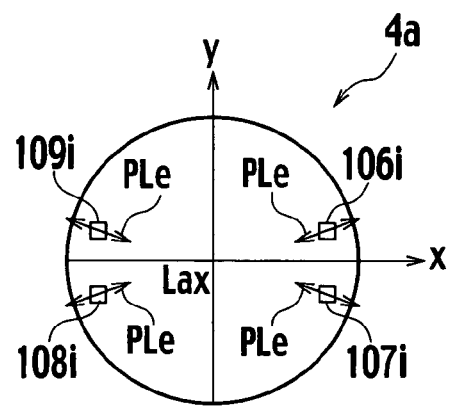
FIG. 28 is a view showing still another example for designating a polarization state according to the embodiment of the present invention.

The polarization states are not limited to polarization directions orthogonal to each other. For example, as shown in FIG. 26, the polarization state of each of the illumination elements 106i to 109i may be circular polarization or non-polarization PLc (simply referred to as non-polarization hereinafter). As shown in FIG. 27, the polarization state of each of the illumination elements 106i to 109i may be linear polarization PLd parallel to a tangential direction of the maximum illumination area 4a (referred to as tangential polarization hereinafter). As shown in FIG. 28, the polarization state of each of the illumination elements 106i to 109i may be linear polarization PLe parallel to a direction radially extending from the optical axis Lax (referred to as radial polarization hereinafter). Further, in the polarization designation module 52 of the designing unit 42, there is no limitation on the number of designated polarization states. In the polarization designation module 52, a single polarization state or a plurality of polarization states may be designated.

As shown in FIG. 7, the illumination areas 104a to 104d are divided into four areas by the area setting module 46. However, there is no limitation on the division of the illumination area. For example, the illumination areas may be divided into two areas, or even eight areas. If the illumination areas are divided into eight areas, illumination light sources can be assigned symmetric with respect to an x axis, a y axis, and a 45° angle axis. Accordingly, with the division of the illumination areas into eight areas, the same illumination light source can be designated, even with a 90° rotation of the illumination area.

For example, as shown in FIGS. 29 to 33, the maximum illumination area 4a is divided into eight areas by the x axis and the y axis orthogonal to one another at the optical axis Lax, and the 45° angle axis, so as to designate illumination areas 130a, 130b, 130c, 130d, 130e, 130f, 130g, and 130h. Among the divided illumination areas 130a to 130h, for example, the illumination area 130a is subdivided to designate a plurality of illumination elements. For each of the plurality of illumination elements, a light source group, which is a set of illumination elements in symmetric positions of the plurality of illumination areas 130a to 130h, is designated.

Figure 29:
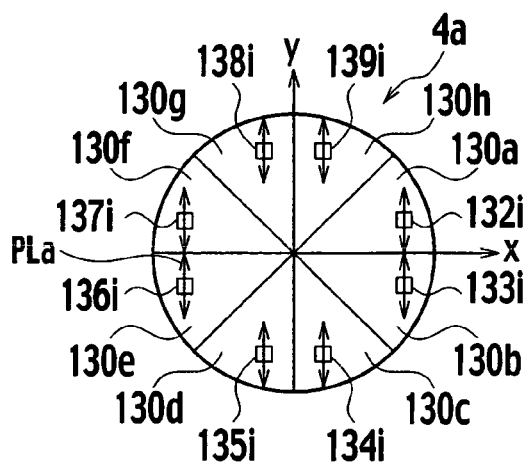
FIGS. 29 to 33 are views showing another examples for designating illumination areas according to the embodiment of the present invention.
Figure 30:
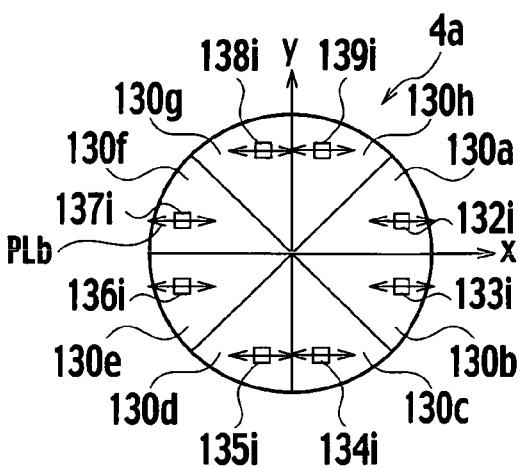
Figure 31:
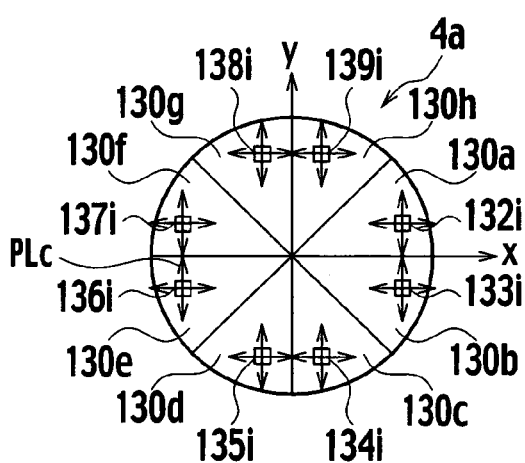
Figure 32:
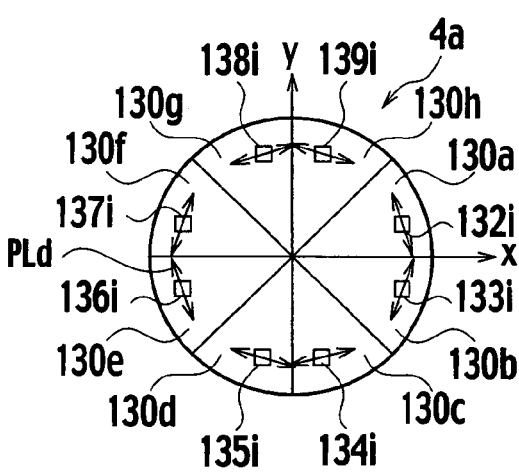
Figure 33:
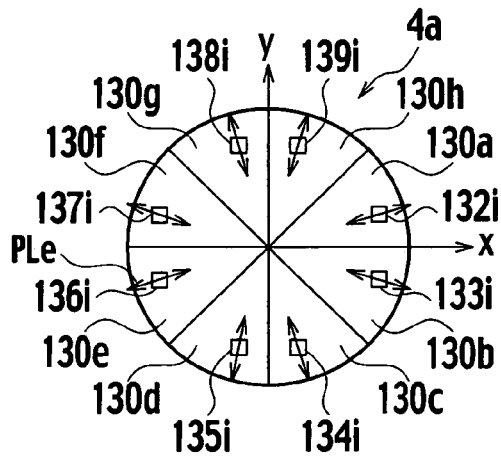

For example, as shown in FIG. 29, an illumination element 133i symmetric to an illumination element 132i with respect to the x axis is disposed in the illumination area 130b. Illumination areas 137i and 136i, respectively symmetric to the illumination elements 132i and 133i with respect to the y axis, are disposed in the illumination areas 130f and 130e. Additionally, illumination elements 139i, 138i, 134i and 135i, respectively symmetric to the illumination elements 132i, 133i, 137i, and 136i with respect to the 45° angle axis, are disposed in the illumination areas 130h, 130g, 130c, and 130d. As a result, the light source group with the illumination elements 132i to 139i are disposed in the maximum illumination area 4a. As shown in FIGS. 29 to 33, the y-polarization PLa, the x-polarization PLb, the non-polarization PLc, the tangential polarization PLd, and the radial polarization PLe can be respectively designated for the illumination elements 132i to 139i.

In the embodiment of the present invention, the image contrast is used as the index for the exposure latitude of the exposure tool. However, the index is not limited to the image contrast. As the index, for example, a normalized image slope at a position corresponding to a mask pattern edge may be used. Here, the "normalized image slope" refers to a slope of an optical image, normalized by the image intensity.

The optical image formed on the resist film coated on the semiconductor substrate is determined by a function of coordinates on the semiconductor substrate using a light intensity transmitted from the transparent photomask, as a reference. When the line pattern of the photomask is irradiated, an optical image is formed on the resist film. A pattern edge of the line pattern is provided by a threshold value of a specific image intensity. In the case of using a positive type photoresist, the resist film is sensitized at a position where an image intensity exceeds the threshold value. A resist pattern may be formed by development at a portion of an area in which the image intensity is below the threshold value.

Figure 34:
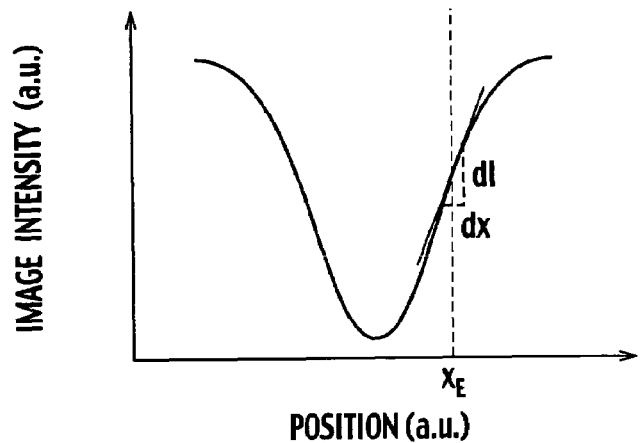
FIG. 34 is a diagram showing an example of a slope of an optical image according to the embodiment of the present invention.
Figure 35:
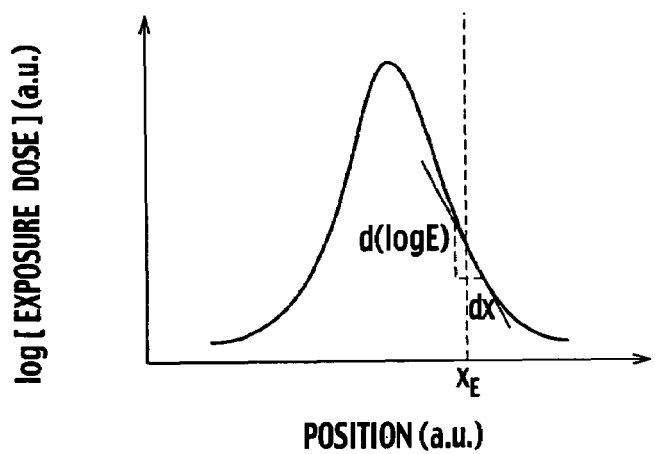
FIG. 35 is a diagram showing an example of a slope of an exposure dose according to the embodiment of the present invention.

For example, as shown in FIG. 34, in an image intensity distribution of the optical image, an image slope in a position $X_E$ corresponding to the pattern edge of the line pattern is dI/dx. As shown in FIG. 35, an exposure dose slope of an exposure dose represented in a logarithmic scale at the position $x_E$ is d{log(E)}/dx (hereinafter referred to an exposure dose log-slope) Here, the image intensity and the exposure dose are in a reciprocal relation. Accordingly, a relation between an exposure dose log-slope and an image slope is represented by the following equation:

$$d\{\log(E)\}/dx = d\{\log(1/I)\}/dx = -d\{\log(I)\}/dx = -(1/I) \times dI/dx \quad (3)$$

From equation (3), the exposure dose log-slope corresponds to the normalized image slope.

For example, in the exposure tool, an illumination light intensity error of the light source 10 or a fluctuation of resist sensitivity may cause a variation in an exposure dose. In terms of the optical image, the variation in exposure dose corresponds to a variation in an image intensity threshold value. As a result, the pattern edge moves to cause a variation in a pattern dimension.

Figure 36:
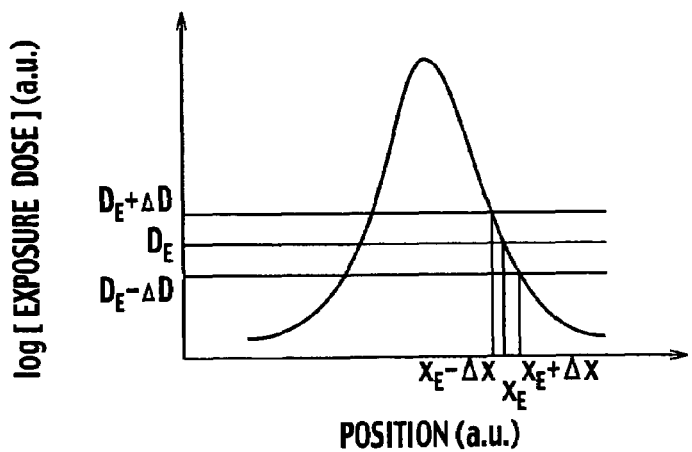
FIG. 36 is a diagram showing an example of an exposure latitude according to the embodiment of the present invention.

The variation in a pattern dimension is desirable within a range of a desired dimension control width ΔCD. FIG. 36 shows a relation between the dimension control width ΔCD at a position $x_E$ and a limit of permissible error of an exposure dose DE, i.e., an exposure latitude EL. The exposure latitude EL and the dimension control width ΔCD are represented by the following equations:

$$EL = 2 \times \Delta D, \quad \Delta CD = 2 \times \Delta x \quad (4)$$

Here, an exposure dose control width is indicated by ΔD, and a dimension control limit is indicated by Δx.

An approximate relation between the exposure dose control width ΔD, and the dimension control width ΔCD is represented by the following equation:

$$\Delta D/\Delta x = d\{\log(E_E)\}/dx \quad (5)$$

Here, the exposure dose in a pattern edge position is indicated by $E_E$. The following equation is a result of the equations (4) and (5):

$$EL = \Delta CD \times [d\{\log(E_E)\}/dx] \quad (6)$$

Here, as shown in the equation (3), d{log($E_E$)}/dx indicates the normalized image slope of a target pattern edge.

It can be understood from the equation (6) that the exposure latitude EL is larger as a value of the normalized image slope at a position of the target pattern edge is larger. In the case of an optical image of a large normalized image slope at a position of the pattern edge, a dimensional variation is low for an exposure dose error. Thus, as in the case of the image contrast of the optical image, the normalized image slope of the pattern edge of the optical image can be used as an index of the exposure latitude.

For example, in a best focus optical image formed by an i-th (i=1 to n) light source group, an image intensity $a_i$ and an image slope $b_i$ at a target pattern edge are calculated. The image slope $b_i$ is divided by the image intensity $a_i$ to calculate a normalized image slope $A_i$. Each of the light source groups is sequenced in descending order of the normalized image slope $A_i$. Considering that the optical image formed on the semiconductor substrate is represented by a sum of intensities of interference waves formed by the plurality of light source groups, a determination value Bm of the exposure latitude represented by the following equation is calculated. Here, K is a suffix indicating descending order.

$$Bm = (a_{K1} + a_{K2} + \ldots + a_{Km})/(b_{K1} + b_{K2} + \ldots + b_{Km}) \quad (7)$$

A maximum integer m of the determination value Bm that satisfies the following equation, is acquired with respect to a dimension control width $\Delta CD$ of the target pattern edge position, and a required exposure latitude EL:

$$Bm > EL/\Delta CD \quad (8)$$

From the equation (8), a set of light source groups in order of 1 to m is extracted as an illumination that optimizes an exposure latitude. Thus, by using the normalized image slope as the index, it is possible to design an illumination light source which increases the exposure latitude EL of the exposure tool to suppress the dimensional variation of the transferred pattern.

In the design of the illumination light source of the exposure tool shown in FIG. 1, the index for the exposure latitude is used as an optical characteristic of the optical image. However, the optical characteristic of the optical image is not limited to the exposure latitude. For example, a focus error may be a cause of a dimensional variation of a transferred pattern, in addition to the exposure dose error. The focus error occurs due to the stage height accuracy of the substrate stage 20, a surface step of the semiconductor substrate 1, and the like.

In terms of the optical image, the focus error corresponds to a variation in shape of the optical image. The pattern edge of the optical image shifts to cause a variation in a pattern dimension of the transferred pattern. Thus, by using an index for focusing the optical image, it is possible to design an illumination light source which suppresses a variation in a pattern dimension caused by a focus error.

Figure 37:
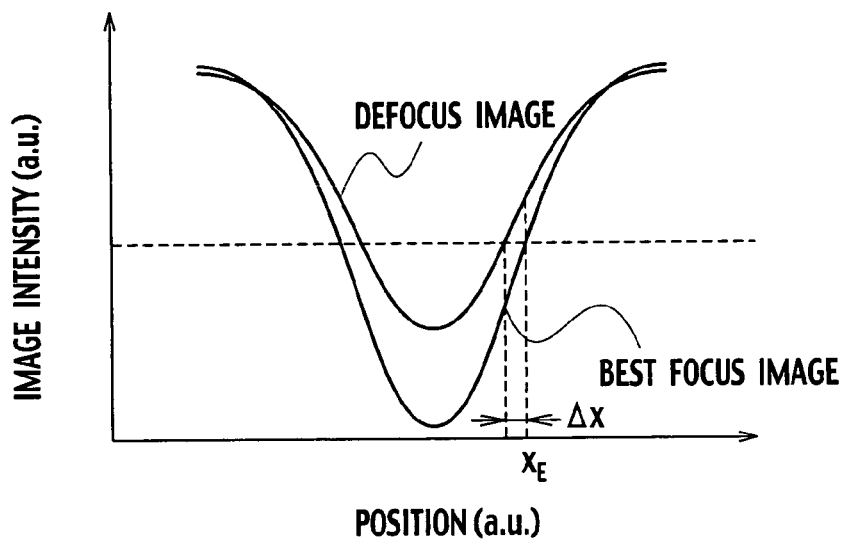
FIG. 37 is a diagram showing an example of a dimensional variation relevant to a depth of focus of an optical image according to the embodiment of the present invention.

For example, as shown in FIG. 37, $I(x_E)$ is an image intensity of a best focus optical image (referred to as a best focus image hereinafter) at a target pattern edge $(x_E)$. $J(x_E)$ is an image intensity of a defocus optical image (referred to as a defocus image hereinafter) at a height of a defocus distance $\Delta z$. $dJ(x_E)/dx$ is an image slope of the defocus image. Here, the defocus distance $\Delta z$ which is indicated by a distance along the optical axis from a best focus position, denotes a magnitude of a focus error.

A "modified normalized image slope" is defined by $\{(dJ(x_E)/dx)/|J(x_E)-I(x_E)|\}$, in which the image slope $dJ(x_E)/dx$ of the defocus image is divided by an absolute value of an image intensity difference between the best focus image intensity $I(x_E)$ and the defocus image intensity $J(x_E)$. When $J(x_E)=I(x_E)$, a numerical value sufficiently larger than the image slope $dJ(x_E)/dx$ is allocated to the modified normalized image slope. A dimensional difference $\Delta cd$ between dimensions of the best focus image and the defocus image is approximated by the following equation using the modified normalized image slope at the target pattern edge:

$$\Delta cd = 2 \times |J(x_E) - I(x_E)|/(dJ(x_E)/dx) \quad (9)$$

From the equation (9), a variation in a pattern dimension caused by a defocus is smaller as the modified normalized image slope in the target pattern edge is larger.

When the defocus distance $\Delta z$ is small with respect to the dimension control width $\Delta CD$ of a target pattern, the dimensional difference $\Delta cd$ can be approximated by a quadratic function of the defocus distance $\Delta z$. In other words, when a dimensional difference of an optical image of the defocus distance $\Delta z$ is $\Delta cd$, a focus error $\Delta X$ can be estimated by the following equation in the case of an arbitrary defocus DF:

$$\Delta X = \Delta cd \times (DF/\Delta z)^2 \quad (10)$$

When the focus error $\Delta X$ is equal to the dimension control width $\Delta CD$, the defocus DF corresponds to an end of the depth of focus DOF. Accordingly, the depth of focus DOF is represented by the following equation:

$$DOF = 2 \times \Delta z \times (\Delta CD/2)^{1/2} \times \{(dJ(x_E)/dx)/|J(x_E)-I(x_E)|\}^{1/2} \quad (11)$$

From the equation (11), an optical image in which a modified normalized image slope increases, has a larger depth of focus DOF. Accordingly, in the optical image having a large modified normalized image slope, a dimensional variation of the transferred pattern becomes small with respect to the focus error. Thus, the modified normalized image slope of the defocus image can be used as an index of depth of focus.

For example, in a best focus plane (first imaging plane) and a defocus plane at a depth of focus end (second imaging plane) a best focus image and a defocus image at the depth of focus end are respectively calculated using the i-th(i=1 to n) light source group. In a target pattern edge position, an image intensity $a_i$ of the best focus image, and an image intensity $ad_i$ and an image slope $bd_i$ of the defocus image at the depth of focus end are determined. The image slope $bd_i$ of the defocus image is divided by an absolute value $|a_i-ad_i|$ of an image intensity difference between the best focus image and the defocus image to calculate a modified normalized image slope $C_i$. Each of the light source groups is sequenced in descending order of the modified normalized image slope $C_i$. Considering that an optical image formed on the semiconductor substrate is represented by a sum of intensities of interference waves formed by a plurality of light source groups, a determination value Dm of depth of focus represented by the following equation is calculated. Here, K is a suffix indicating descending order.

$$Dm = (bd_{K1} + bd_{K2} + \ldots + bd_{Km})/(|a_{k1} - ad_{K1}| + |a_{K2} - ad_{K2}| + \ldots + |a_{Km} - ad_{Km}|) \quad (12)$$

A maximum integer m of the determination value Dm that satisfies the following equation is determined with respect to the dimension control width $\Delta CD$ of the target pattern edge position.

$$Dm > (DOF/\Delta z) \times \{1/(2 \times \Delta CD)\}^{1/2} \quad (13)$$

From the equation (13), a set of light source groups of order 1 to m is extracted as an illumination that optimizes the depth of focus. Thus, by using the modified normalized image slope as the index, it is possible to design an illumination light source which improves the depth of focus of the exposure tool and suppresses a dimensional variation of the transferred pattern.

Furthermore, by combining an optimal illumination provided from a first index for the exposure latitude and an optimal illumination provided from a second index for the depth of focus, it is possible to design an illumination light source which can simultaneously improve the exposure latitude and the depth of focus of the exposure tool. Here, an image contrast or a normalized image slope for the exposure latitude is assigned as the first index, and a modified normalized image slope for the depth of focus is assigned as the second index.

Other Embodiments

In the embodiment of the present invention, the optical image is calculated based on a vector model and by considering polarization. However, the calculation of the optical image is not so limited. A simulation model considering polarization influence may be used. For example, it is possible to use a latent image averaging model in which a latent image intensity distribution formed in a resist film is averaged in a height direction; a model using an immersed image which is formed in a predetermined plane in a liquid in the vicinity of a surface of the semiconductor substrate by immersion lithography; a model which modifies an optical image based on a behavior of an acid in the resist film during post exposure baking (PEB), a dissolution characteristic of the resist film during development, and the like.

Figure 38:
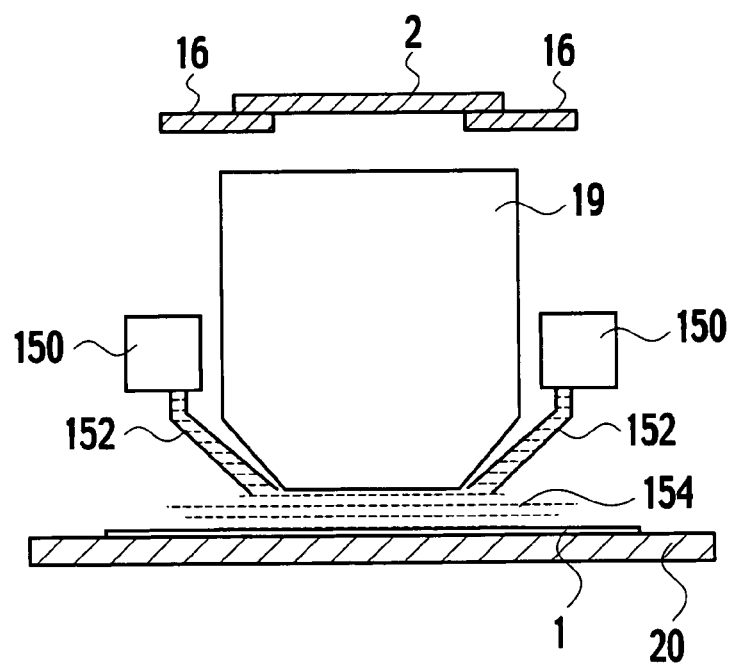
FIG. 38 is a schematic block diagram of an immersion lithography tool for explaining another embodiment of the present invention.

An immersion lithography tool is used when executing immersion lithography. As shown in FIG. 38, in the immersion lithography tool, a liquid 154 such as water, is interposed between a projection optical system 19 and a surface of a semiconductor substrate 1 placed on a substrate stage 20. The liquid 154 is fed through a nozzle 152 from a liquid feeder 150. In addition, a light source, an illumination optical system and the like are not shown. An illumination light emitted from the projection optical system 19 is projected through the liquid 154 onto the semiconductor substrate 1. Accordingly, the depth of focus can be increased, and a maximum limit of a numerical aperture NA of the projection optical system 19 can be increased. Therefore, by applying a method for designing an illumination light source according to the embodiment of the present invention, it is possible to further improve the exposure latitude and the depth of focus of the immersion lithography tool, and to suppress a dimensional variation of a transferred pattern.

Various modifications will become possible for those skilled in the art after storing the teachings of the present disclosure without departing from the scope thereof.

What is claimed is:

1. A computer implemented method for designing an illumination light source, comprising:
   acquiring a control feature configured to control a dimension of a transferred pattern of a mask pattern;
   designating a plurality of illumination elements illuminating the mask pattern;
   designating first illumination lights to each of first polarization states of a light emitted from each of the illumination elements;
   calculating a first optical image of the control feature, the first optical image formed on a first imaging plane by each of the first illumination lights, the first imaging plane being a best focus plane;
   determining optimal polarization states of the first illumination lights from among the first polarization states, based on an optical characteristic of the first optical image;
   calculating a second optical image of the control feature, the second optical image formed on a second imaging plane by each of the first illumination lights, the second imaging plane being a defocus plane; and
   determining an illumination shape and a polarization state distribution of the light, based on optical characteristics of the first and second optical images and the optimal polarization states.

2. The method of claim 1, further comprising:
   designating second illumination lights to each of second polarization states of the light emitted from each of the illumination elements; and
   calculating a third optical image of the control feature, the third optical image formed on the first imaging plane by each of the second illumination lights;
   wherein, processing for determining the illumination shape and the polarization state distribution is based on optical characteristics of the first and second optical images.

3. The method of claim 1, wherein each of the optical characteristics is one of an image contrast of the first optical image and an image slope normalized by an image intensity at a pattern edge of the first optical image.

4. The method of claim 1, wherein the mask pattern periodically arranges the control feature in a period direction.

5. The method of claim 4, wherein the first polarization state is a linear polarization having a polarization direction orthogonal to the period direction.

6. The method of claim 1, wherein the defocus plane is provided at a depth of focus end.

7. The method of claim 1, wherein the first optical image is calculated by a light source group which is a set of illumination elements in symmetrical positions with respect to an optical axis orthogonal to a plane of the illumination elements.

8. The method of claim 1, wherein the illumination shape and the polarization state distribution are determined by extracting the illumination elements providing a calculated value of each of the optical characteristics equal to or less than a reference value.

9. A computer implemented method for correcting a mask pattern, comprising:
   acquiring a control feature configured to control a dimension of a transferred pattern of a mask pattern;
   designating a plurality of illumination elements illuminating the mask pattern;
   designating first illumination lights to each of first polarization states of a light emitted from each of the illumination elements;
   calculating a first optical image of the control feature, the first optical image formed on a first imaging plane by each of the first illumination lights, the first imaging plane being a best focus plane;
   determining optimal polarization states of the first illumination lights from among the first polarization states, based on an optical characteristic of the first optical image;
   calculating a second optical image of the control feature, the second optical image formed on a second imaging plane by each of the first illumination lights, the second imaging plane being a defocus plane;
   providing an illumination light source by determining an illumination shape and a polarization state distribution of the light, based on optical characteristics of the first and second optical image images and the optimal polarization states; and
   calculating a dimensional variation of the transferred pattern by the illumination light source so as to correct the mask pattern.

10. The method of claim 9, further comprising:
    designating second illumination lights to each of second polarization states of the light emitted from each of the illumination elements; and calculating a third optical image of the control feature, the third optical image formed on the first imaging plane by each of the second illumination lights;

wherein, processing for determining the illumination shape and the polarization state distribution is based on optical characteristics of the first to third optical images.

11. The method of claim 9, wherein each of the optical characteristics is one of an image contrast of the first optical image and an image slope normalized by an image intensity at a pattern edge of the first optical image.

12. The method of claim 9, wherein the mask pattern periodically arranges the control feature in a period direction.

13. The method of claim 12, wherein the first polarization state is a linear polarization having a polarization direction orthogonal to the period direction.

14. The method of claim 9, wherein the first optical image is calculated by a light source group which is a set of illumination elements in symmetrical positions with respect to an optical axis orthogonal to a plane of the illumination elements.

15. The method of claim 9, wherein the illumination shape and the polarization state distribution are determined by extracting the illumination elements providing a calculated value of each of the optical characteristics equal to or less than a reference value.

16. A method for manufacturing a photomask, comprising:

acquiring a control feature configured to control a dimension of a transferred pattern of a mask pattern;

designating a plurality of illumination elements illuminating the mask pattern;

designating first illumination lights to each of first polarization states of a light emitted from each of the illumination elements;

calculating a first optical image of the control feature, the first optical image formed on a first imaging plane by each of the first illumination lights, the first imaging plane being a best focus plane;

determining optimal polarization states of the first illumination lights from among the first polarization states, based on an optical characteristic of the first optical image;

calculating a second optical image of the control feature, the second optical image formed on a second imaging plane by each of the first illumination lights, the second imaging plane being a defocus plane;

providing an illumination light source by determining an illumination shape and a polarization state distribution of the light, based on optical characteristics of the first and second optical images and the optimal polarization states;

calculating a dimensional variation of the transferred pattern by the illumination light source so as to correct the mask pattern; and generating the photomask based on the corrected mask pattern.

17. A method for manufacturing a semiconductor device, comprising:

acquiring a control feature configured to control a dimension of a transferred pattern of a mask pattern;

designating a plurality of illumination elements illuminating the mask pattern;

designating first illumination lights to each of first polarization states of a light emitted from each of the illumination elements;

calculating a first optical image of the control feature, the first optical image formed on a first imaging plane by each of the first illumination lights, the first imaging plane being a best focus plane;

determining optimal polarization states of the first illumination lights from among the first polarization states, based on an optical characteristic of the first optical image;

calculating a second optical image of the control feature, the second optical image formed on a second imaging plane by each of the first illumination lights, the second imaging plane being a defocus plane;

providing an illumination light source by determining an illumination shape and a polarization state distribution of the light, based on optical characteristics of the first and second optical images and the optimal polarization states;

calculating a dimensional variation of the transferred pattern by the illumination light source so as to correct the mask pattern;

generating a photomask based on the corrected mask pattern;

adjusting an exposure tool, based on the illumination light source;

loading a semiconductor substrate coated with a resist film to the exposure tool; and projecting an image of the photomask onto the semiconductor substrate, so as to transfer the corrected mask pattern on the resist film, and to form a resist pattern.

18. A computer program product stored on a computer-readable medium of a computer and configured to be executed by the computer, comprising:

an instruction to acquire a control feature configured to control a dimension of a transferred pattern of a mask pattern;

an instruction to designate a plurality of illumination elements illuminating the mask pattern;

an instruction to designate first illumination lights to each of first polarization states of a light emitted from each of the illumination elements;

an instruction to calculate a first optical image of the control feature, the first optical image formed on a first imaging plane by each of the first illumination lights, the first imaging plane being a best focus plane;

an instruction to determine optimal polarization states of the first illumination lights from among the first polarization states, based on an optical characteristic of the first optical image;

an instruction to calculate a second optical image of the control feature, the second optical image formed on a second imaging plane by each of the first illumination lights, the second imaging plane being a defocus plane; and an instruction to determine an illumination shape and a polarization state distribution of the light, based on optical characteristics of the first and second optical images and the optimal polarization states.

* * * * *